United States Patent [19]

Nath et al.

[11] Patent Number: 4,617,421
[45] Date of Patent: Oct. 14, 1986

[54] PHOTOVOLTAIC CELL HAVING INCREASED ACTIVE AREA AND METHOD FOR PRODUCING SAME

[75] Inventors: Prem Nath, Rochester; Masatsugu Izu, Birmingham; Herbert C. Ovshinsky, Oak Park; Avtar Singh, Detroit, all of Mich.

[73] Assignee: Sovonics Solar Systems, Troy, Mich.

[21] Appl. No.: 718,970

[22] Filed: Apr. 1, 1985

[51] Int. Cl.⁴ .................. H01L 25/02; H01L 31/18
[52] U.S. Cl. .................................. 136/244; 136/249; 136/251; 136/258; 29/572; 29/588
[58] Field of Search ............... 136/244, 245, 249 TJ, 136/258 AM, 251; 29/572, 588

[56] References Cited

U.S. PATENT DOCUMENTS 3,369,939  2/1968  Myer ................................. 136/246
3,459,597  8/1969  Baron ............................... 136/244
4,419,530 12/1983  Nath ................................. 136/251

FOREIGN PATENT DOCUMENTS

56-79476  6/1981  Japan ............................... 136/244

Primary Examiner—Aaron Weisstuch
Attorney, Agent, or Firm—Ronald W. Citkowski; Marvin S. Siskind

[57] ABSTRACT

An improved large area photovoltaic device includes a plurality of electrically interconnected smaller area cells. The smaller area cells each have a laterally disposed bus bar and are disposed in overlapping relationships so that the bus bar of a given cell is beneath the substrate of the adjacent overlapping cell. In this manner the surface of the resulting large area device available for photovoltaic power generation is maximized. Also disclosed herein are methods for the manufacture of the improved device.

28 Claims, 8 Drawing Figures

PHOTOVOLTAIC CELL HAVING INCREASED ACTIVE AREA AND METHOD FOR PRODUCING SAME

FIELD OF THE INVENTION

This invention relates generally to large area photovoltaic devices particularly adapted for use as solar cells. The invention relates more particularly to large area photovoltaic devices formed from a plurality of smaller area photovoltaic cells and to methods for the manufacture thereof.

BACKGROUND OF THE INVENTION

The instant invention includes improved, large area photovoltaic devices formed from a plurality of electrically interconnected smaller area photovoltaic cells, as well as methods for the manufacture of such devices. The large area photovoltaic device of the instant invention has a larger active area available for the conversion of incident light to electricity as compared to previously available photovoltaic devices because masking of the active are a by the current carrying bus bars of the device is eliminated.

Single crystal photovoltaic devices, especially silicon photovoltaic devices, have been utilized for some time as sources of electrical power because they are inherently non-polluting, silent, and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their thin film counterparts; and (3) are expensive and time consuming to fabricate.

Recently, considerable efforts have been made to develop processes for depositing amorphous semiconductor films, each of which can encompass relatively large areas, and which can be doped to form p-type and n-type materials for the production of p-i-n type devices substantially equivalent to those produced by their crystalline counterparts. It is to be noted that the term "amorphous" as used herein, includes all materials or alloys which have long range disorder, although they may have short or intermediate range order or even contain, at times, crystalline inclusions. As used herein, the term "microcrystalline" is defined as a unique class of said amorphous material characterized by a volume fraction of crystalline inclusions, said volume fraction of inclusions being greater than a threshold value at which the onset of substantial changes in certain key parameters such as band gap, electrical conductivity, and absorption constant occurs. It is to be noted that pursuant to the foregoing definitions a microcrystalline semiconductor alloy falls within the generic term "amorphous".

For many years, such work with amorphous silicon or germanium films was substantially unproductive because of the presence therein of microvoids and dangling bonds which produce a high density of localized states in the energy gap, which states are derogatory to the electrical properties of such films. Initially, the reduction of the localized states was accomplished by glow discharge deposition of amorphous silicon films wherein silane ($SiH_4$) gas is passed through a reaction tube, where the gas is decomposed by a radio frequency (r.f.) glow discharge and deposited on a substrate maintained at a temperature of about 500-600 degrees K. (227-327 degrees C.). The material so deposited on the substrate is an intrinsic amorphous material consisting of silicon and hydrogen. To produce a doped amorphous material an N-dopant such as phosphine gas ($PH_3$), or a P-dopant such as diborane ($B_2H_6$) gas, is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare by low discharge or vapor deposition thin film amorphous silicon or germanium alloys in large areas, said alloys possessing acceptable concentrations of localized states in the energy gaps thereof and high quality electronic properties. Suitable techniques are fully described in U.S. Pat. No. 4,226,898, entitled "Amorphous Semiconductor Equivalent to Crystalline Semiconductors," of Stanford R. Ovshinsky and Arun Madan which issued Oct. 7, 1980, in U.S. Pat. No. 4,217,374, under the same title to Stanford R. Ovshinky and Masatsugu Izu, which issued on Aug. 12, 1980, U.S. Pat. No. 4,504,518 of Stanford R. Ovshinsky, David D. Allred, Lee Walter, and Stephen J. Hudgens, entitled "Method of Making Amorphous Semiconductor Alloys and Devices Using Microwave Energy," which patents are assigned to the assignees of the instant invention, the disclosures of which are incorporated herein by reference. As disclosed in these patents, it is believed that compensating agents such as fluorine and/or hydrogen introduced into the amorphous semiconductor operate to substantially reduce the density of the localized states therein and facilitate the addition of other alloying materials.

Since amorphous alloys may be readily deposited atop a wide variety of substrates and over large areas, it is now possible to readily fabricate multiple cell stacked photovoltaic structures. The concept of utilizing multiple cells, to enhance photovoltaic device efficiency, was disclosed at least as early as 1955 by E. D. Jackson, in U.S. Pat. No. 2,949,498, issued Aug. 16, 1960. The multiple cell structures therein disclosed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell while the short circuit current remains substantially constant. It should be noted that Jackson employed crystalline semiconductor materials for the fabrication of the stacked cell device; however, it is virtually impossible to match lattice constants of differing crystalline materials. Therefore, it is not possible to fabricate such crystalline tandem structures in a commercially feasible manner. As the assignee of the instant invention has shown, such tandem structures are not only possible, but can be economically fabricated in large areas by employing amorphous materials.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon alloys can be deposited in multiple layers over large area substrates to form solar cells in a high volume, continuous processing system. Such continuous processing systems are disclosed in the following U.S. Pat. No. 4,400,409, for A Method of Making P-Doped Silicon Films And Devices Made Therefrom; U.S. Pat. No. 4,410,588, for Continuous Amorphous Solar Cell Deposition And Isolation System And Method; U.S. Pat. No. 4,542,711 for Continuous Systems For Depositing Amorphous Semiconductor Material; U.S. Pat. No. 4,492,181, for Method And Apparatus For Continuously Producing Tandem Amorphous Photovoltaic Cells; and U.S. Pat. No. 4,485,125 for Method And Apparatus For Continuously Producing Tandem Amorphous Photovoltaic Cells. As disclosed in these Patents, the disclosures of which are incorporated herein by reference, a substrate may be continuously advanced through a succession of deposition chambers, wherein each chamber is dedicated to the deposition of a specific semiconductor material. In making a solar cell of p-i-n type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy.

Since each deposited semiconductor alloy, and especially the intrinsic semiconductor alloy, must be of high purity: (1) the deposition environment in the intrinsic depositon chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

While various configurations of thin film photovoltaic cells may, as detailed hereinabove, be readily fabricated, it is frequently desirable to form large area modules out of cells. Incorporation of smaller area cells into large area modules offers several advantages. First, and most obviously, the surface area of the resulting module can be made quite large so as to provide for large scale power production. Secondly, by assembling a module from series and/or parallel interconnected cells, the voltage and current characteristics of the resulting module may be readily selected to match the power output thereof to specific applications. Thirdly, forming cells into modules allows for the manufacture of very high efficiency photovoltaic devices, insofar as the modules may be formed from the very best smaller area cells available.

Large area modules are generally formed by electrically interconnecting smaller area photovoltaic cells in the appropriate series and/or parallel configuration. The completed module is frequently encapsulated in a protective, light transmissive coating so as to assure mechanical integrity thereof and protection from ambient conditions. It should be noted that for purposes of clarity and explanation the module will be described herein as a large area photovoltaic device comprised of electrically interconnected smaller area photovoltaic cells. The term "smaller area photovoltaic cell" is used in its broadest sense, and is intended to designate any sub-portion of the module capable of providing an electrical current in response to the absorption of light. The term "cell" is not meant to be limited to a single n-i-p type p-n type or other photovoltaic device, but is meant to include stacked tandem arrays of photovoltaic cells. The term "smaller area photovoltaic cell" is used herein is also meant to include variously configured devices which may also include several interconnected photovoltaic regions thereupon. Generally speaking, the term "smaller area photovoltaic cell" is simply meant to define any photovoltaic unit, however configured, which is assembled with other such units to provide a large area photovoltaic device. Specifically, the term "smaller area photovoltaic cell" includes relatively larger strips which may be interconnected according to the principles disclosed herein.

It is obviously desirable to manufacture large area photovoltaic modules, as is evidenced by the variety of configurations of modules presently known. A more detailed discussion of some of such module designs will be had hereinbelow.

Clearly, it is desirable for any module to have the maximum photoconversion efficiency attainable. The efficiency may be improved via two routes: (1) the semiconductor materials, and the cells fabricated therefrom may be optimized to yield the highest photoconversion efficiency and (2) the configuration of the module itself may be optimized to secure the maximum advantage of the improved semiconductor materials and cells.

Now that the assignee of the instant invention is capable of manufacturing high quality photovoltaic alloys and incorporating those alloys into highly efficient photovoltaic cell configurations, it is desirable to maximize the efficiency of modules fabricated therefrom so as to make full use of these improved materials and cells. One significant source of loss in the efficiency of large area photovoltaic cell modules is resultant from shading of the active area thereof by portions of the current collecting bus grid system.

As will be described in greater detail hereinbelow, photovoltaic cells, particularly large area photovoltaic cells require a current collection system, generally referred to as a bus-grid system, for collecting photogenerated current and conveying that current to a collection point such as a terminal of the device. The bus-grid system is typically formed of a highly conductive material such as a metallic member, or a conductive ink or paste pattern. The various materials employed for the fabrication of the bus-grid system are optically opaque and thus shade portions of the photovoltaic cell disposed directly therebeneath, rendering those portions inactive. While it is necessary to have a bus-grid system in order to increase the collection efficiency of the cell, losses resulting from the shading are derogatory to the performance of the cell. Accordingly, a device performance has heretofore been optimized by striking a fine balance between: (1) the series resistance imposed upon the photovoltaic device by the bus-grid pattern; (2) loss of efficiency resultant from bus-grid shading. Since the bus bar portion of the bus-grid pattern is by far the member which occupies the largest area, it would therefore be desirable to have a large area photovoltaic device having no losses resultant from bus bar shading of photovoltaic material.

In accord with the principles of the instant invention, applicants have designed and manufactured an improved large area photovoltaic device which eliminates the problem of bus bar shading. The photovoltaic device of the instant invention allows for maximum utilization of the surface thereof for the photo generation of electrical current and accordingly, allows for full utilization of the photoconversion efficiency of assignee's semiconductor alloys and cells.

BRIEF DESCRIPTION OF THE INVENTION

There is disclosed herein an improved large area photovoltaic device which is comprised of a plurality of electrically interconnected smaller area photovoltaic cells. Each of the smaller area cells includes a substrate having at least one electrically conductive base electrode region formed thereupon, a semiconductor body disposed upon the substrate in electrical communication with the base electrode region and at least one relatively transparent top electrode member disposed upon the semiconductor body. The base electrode region, semiconductor body and top electrode member cooperate to provide at least one photovoltaic region in each of the smaller area cells, each photovoltaic region adapted to absorb incident light and generate electrical current. Each of the smaller area cells also includes an electrically conductive bus bar disposed proximate one edge thereof for conveying electrical current generated by the smaller area cell to a collection point. The large area device is comprised of a plurality of the smaller area photovoltaic cells disposed in overlapping relationship so that the bus bar of at least one of the cells is disposed beneath the substrate of an adjacent cell. In this manner the bus bar is effectively hidden and the entire surface of the large area photovoltaic device is thus available for the generation of electrical current.

The large area device will typically further include means for electrically interconnecting the smaller area cells in a series, parallel, or series-parallel arrangement. Interconnection may be accomplished by use of a copper strip attached to the bus bar and either the base or top electrode of an adjoining smaller area cell.

In another embodiment, a series electrical connection may be readily established by electrically affixing the bus bar of one smaller cell to the overlying electically conductive substrate of an adjacent cell by means of the electrically conductive adhesive or the like.

The smaller area cells may be formed in a variety of configurations, and from a variety of photovoltaic materials. Among the preferred materials are amorphous silicon, amorphous germanium, and amorphous silicon-germanium alloys. The semiconductor alloy layers of the smaller area cells may be configured as either single cells, or stacked tandem cells. If a stacked arrangement is employed, the cells will preferably be disposed so that the narrowest band gap cell will be most proximate the light incident surface of the smaller area cell and the widest band gap cell will be most distal the light incident surface thereof.

In some embodiments of the instant invention it is desirable to encapsule the larger area photovoltaic device in a protective encapsulant layer so as to prevent mechanical damage and degradation by ambient conditions. Also disclosed herein are methods for the manufacture of the improved large area photovoltaic device.

I. THE PHOTOVOLTAIC CELL

Figure 1:
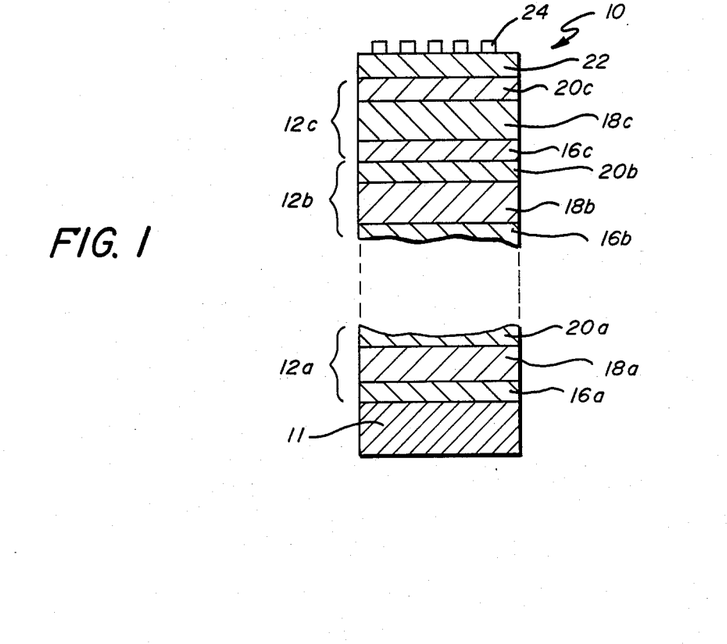
FIG. 1 is a fragmentary, cross-sectional view of a tandem photovoltaic device, of the type in which may be employed in the practice of the instant invention, and comprising a plurality of n-i-p type photovoltaic cells.

Referring now to the drawings and particularly to FIG. 1, a photovoltaic cell, formed of a plurality of successive n-i-p layers, each of which includes, preferably, an amorphous thin film semiconductor alloy material is shown generally by the reference numeral 10.

More particularly, FIG. 1 shows an n-i-p type photovoltaic device such as a solar cell made up of individual n-i-p type cells 12a, 12b, and 12c. Below the lowermost cell 12a is a substrate 11 which may be formed of a rigid or flexible transparent glass or a synthetic polymeric member; or formed from a metallic material such as stainless steel, aluminum, tantalum, molybdenum, chrome; or formed from metallic particles embedded within an insulator. Although certain applications may require a thin oxide layer and/or a series of base contacts prior to the deposition of semiconductor alloy material, the term "substrate" shall include not only a flexible film, but also any elements added thereto by preliminary processing. Also included within the scope of the present invention are substrates formed of synthetic polymers and metals coated with a synthetic polymer to which one or more conductive base electrodes are applied.

Each of the cells 12a, 12b, and 12c are preferably fabricated with a thin film semiconductor body containing at least a silicon or silicon:germanium alloy. Each of the semiconductor bodies incudes a p-type conductivity semiconductor layer 20a, 20b, or 20c; a substantially intrinsic semiconductor layer 18a, 18b, or 18c; and an n-type conductivity semiconductor layer 16a, 16b, or 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Similarly, the tandem cell may include only two stacked cells. Also, although n-i-p photovoltaic cells are illustrated, the improved large area module of this invention may also be fabricated from differently configured photovoltaic cells including single or multiple p-i-n cells, Schottky barrier cells, p-n cells and the like. The term "n-i-p type" as used herein is meant to include any aggregation of n, i, and p layers operatively disposed to provide a photoactive region for generating charge carriers in response to the absorption of photon energy.

It is to be understood that following the deposition of the semiconductor alloy layers, a further deposition process may be either performed in a separate environment or as a part of a continuous process. In this step, a TCO (transparent conductive oxide) layer 22, preferably formed of indium tin oxide, is added atop the p-layer 20c of the top most cell 12c, to function as the top electrode of the cell 10. An electrode grid 24 may be added to the device where the cell is of a sufficiently large area, or if the conductivity of the TCO layer 22 is insufficient to assume efficient collection of photogenerated current. The grid 24 is adapted to shorten the carrier path and increase the conductive efficiency. As discussed previously, the intrinsic layers 18a, 18b, and 18c and 18c of the cells 12a, 12b, and 12c may be formed from alloy materials having different band-gaps. For example, 18c may have a band gap of approximately 1.7 eV, 18b may have a band gap of approximately 1.5 eV, and 18a may have a band gap approximately 1.3 eV. In this manner, most efficient use may be made of a large portion of the incident solar spectrum.

II. THE MULTIPLE GLOW DISCHARGE DEPOSITION CHAMBERS

Figure 2:
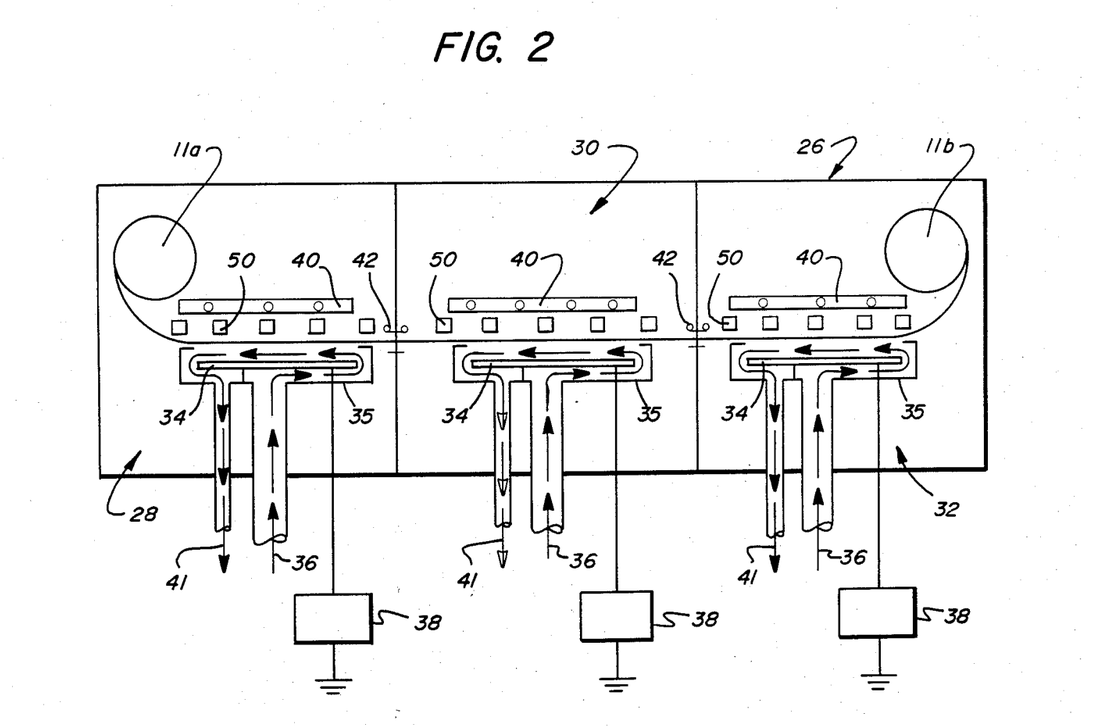
FIG. 2 is a schematic view of a multiple chamber deposition apparatus of the type which may be employed for the fabrication of the tandem photovoltaic cell of FIG. 1.

Turning now to FIG. 2, a diagrammatic representation of multiple glow discharge chamber deposition apparatus for the continuous production of semiconductor cells is generally illustrated by the reference numeral 26. The apparatus 26 includes a plurality of isolated, dedicated deposition chambers, each chamber of which is interconnected by a gas gate 42 through which (1) sweep gases, and (2) a web of substrate material 11 are adapted to unidirectionally pass. It is in an apparatus of this type that photovoltaic cells similar to the cell 10 of FIG. 1, may be readily manufactured.

The apparatus 26 is adapted to mass deposit amorphous semiconductor layers n-i-p configuration onto the surface of the web of substrate material 11 which is continually fed therethrough. To deposit the semiconductor layers required for producing multiple n-i-p type cells, the apparatus 26 includes at least one triad of deposition chambers. Each triad of deposition chambers comprises: a first deposition chamber 28 in which an n-type conductivity semiconductor layer is deposited onto the deposition surface of the substrate 11 as the substrate 11 passes therethrough; a second deposition chamber 30 in which an intrinsic semiconductor layer is deposited atop the p-type layer on the deposition surface of the substrate 11 as the substrate 11 passes therethrough; and a third deposition chamber 32 in which a p-type semiconductor layer is deposited atop the intrinsic layer on the deposition surface of the substrate 11 as the substrate 11 passes therethrough. It should be apparent that (1) although, only one triad of deposition chambers has been illustrated, additional triads or additional individual chambers may be added to the apparatus to provide the machine with the capability of producing photovoltaic cells having any number of n-i-p type semiconductor layers; (2) the substrate supply core 11a and the substrate take-up core 11b are shown in the deposition chambers for illustrative purposes only, while in reality the cores would be housed in separate chambers operatively connected to the deposition chambers; (4) although the glow discharge apparatus illustrated herein employs cathodes with r.f. power, other energy supplies, such as a.c. power generators, microwave generators, and d.c. power generators, may be employed without departing from the spirit of the present invention; and (5) the gaseous precursor source of semiconductor alloy material may be introduced to flow in a direction transverse, parallel, or parallel but opposite to the direction of substrate travel.

Each deposition chamber, 28, 30, and 32 of the triad is adapted to deposit a single semiconductor layer, by glow discharge deposition, onto the electrically conductive substrate 11. To that end, each of the deposition chambers 28, 30, and 32 includes: a cathode 34; a shield 35 disposed about each of the cathodes 34; a process gas supply conduit 36; a radio frequency generator or other source of electromagnetic power 38; a process g and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber.

The supply conduits 36 are operatively associated with the respective cathodes 34 or other decomposition mechanism to deliver process gas mixtures to the plasma, or other decomposition regions created in each deposition chamber between said decomposition mechanism and the substrate 11. The cathode shields 35 are adapted to operate in conjunction with the web of substrate material 11 and the evacuation conduit 41 to confine the process gases within the cathode region of the deposition chambers.

The radio frequency or other similar type of power generator 38 operates in conjunction with the cathodes 34, the radiant heaters 40 and the grounded substrate 11 to form the plasma by disassociating and recombining the elemental reaction gases entering the deposition chambers into deposition species and compounds. These species and compounds are then deposited onto the bottom surface of the substrate 11 as semiconductor layers. The substrate 11 is maintained substantially flat by the plurality of rows of magnetic elements 50 which provide an attractive force urging the substrate 11 upwardly, out of its normal sagging path of travel.

To form the photovoltaic cell 10 illustrated in FIG. 1, an n-type amorphous semiconductor layer is deposited onto the substrate 11 in the dopant deposition chamber 28, an intrinsic amorphous semiconductor layer is deposited atop the n-type layer in the deposition chamber 30, and a p-type amorphous semiconductor layer is deposited atop the intrinsic layer in the deposition chamber 32. As a result, in the preferred embodiment, the apparatus 26 deposits at least three amorphous semiconductor layers onto the substrate 11 with the intrinsic layer deposited in deposition chamber 30 differing in composition from the layers deposited in deposition chambers 28 and 32 by the absence of at least one element which will be referred to as the dopant or doping species.

III. THE IMPROVED LARGE AREA PHOTOVOLTAIC DEVICE

Figure 3:
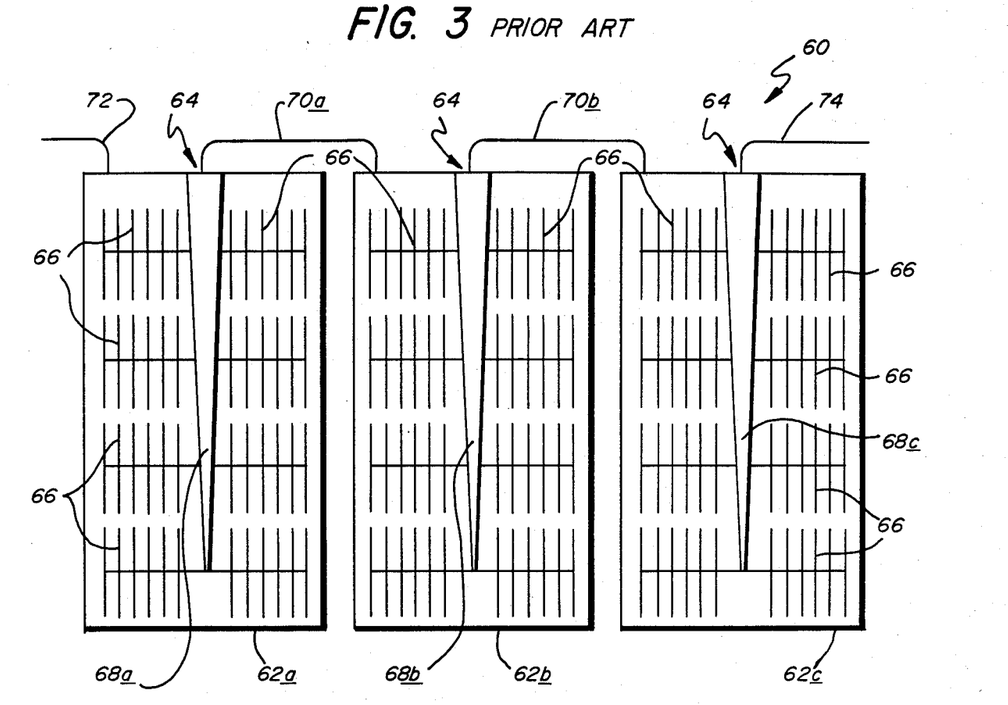
FIG. 3 is a depiction of a prior art large area photovoltaic module illustrating the exposed bus bars thereof.

In order to better understand the advantages and operation of the instant invention, a brief discussion of prior art, large area, inconnected photovoltaic modules will be helpful. Referring now to FIG. 3, there is shown one particular configuration of prior art large area photovoltaic device or module 60. The large area module 60 is comprised of a plurality smaller area photovoltaic cells 62a, 62b, 62c. Each of the small area photovoltaic cells 62 is comprised of a plurality of superposed layers of semiconductor material generally similar to those comprising the photovoltaic cell 10 of FIG. 1.

Each of the cells 62, includes a bus-grid pattern 64 formed upon the top most surface thereof. The bus-grid pattern 64 incudes a plurality of current collecting grids 66 in electrical communication with the top electrode of the cell. The grids 66 collect photogenerated current and convey that current to a bus bar 68. It will be noted that the bus bar 68 is a relatively wide structure having an end-to-end taper, and generally formed from a screen printed paste. Copper strips or other such conductive members may be similarly utilized to form the bus bar 68. The bus bar must be made relatively wide so as to enable it to carry photogenerated current without adding significant series resistance to the small area cell 62. The reason for the taper is that the current carrying capacity of the bus bar 68 must increase along the way to accomodate increased amounts of current.

The individual small area photovoltaics cell 62a, 62b. and 62c are electrically interconnected in a series arrangement by means of interconnect wires 70. It will be noted that the first interconnect wire 70a connects the bus bar 68a of the first small area photovoltaic cell 62a to the substrate electrode of the second small area photovoltaic cell 62b; and the second interconnect wire 70b connects the bus bar 68b of the second small area of photovoltaic cell 62b to the substrate electrode of the third photovoltaic cell 62c. Electrical current is withdrawn from the module 60 by means of a first terminal connection 72 made to the substrate of the first small area photovoltaic cell 62a and a second terminal connection 74, made to the bus bar 68c of the third small area photovoltaic cell 62C. In this manner a series connected module is provided. Obviously a larger or smaller number of sub-cells may be similarly connected and these connections may also be made in parallel and mixed series parallel configuration.

While the prior art module illustrated in FIG. 3 functions reliably as a source of photovoltaic power, the design thereof inherently decreases its ultimate operating efficieny. As discussed previously, the problem of shading by the bus bars 68 represents a significant loss in photogenerating capability, since the area is directly beneath each bus bar 68 is not illuminated and therefore incapable of producing photocurrent. Secondly, the individual cells 62a, 62b and 63c are spacedly separated from one another by a small distance, thus resulting in more dead space on the module surface. While it is true that this distance may be decreased by moving the cells closer together, there will nonetheless still be a finite distance separating them; furthermore, if the sub-cells are placed in too close a proximity electrical short circuiting may occur therebetween. The shorting problem may be addressed by providing electrical insulation upon the edges of theub-cells; however, such a solution is wasteful of time, and labor, and results in still more nonproductive areas in the resulting module.

One approach to the problem of bus bar shading completely eliminates the bus bars and relies instead upon the use of a relatively thin serpentine wire for current collection. According to this solution, not illustrated herein, a relatively thin highly conductive wire is snaked back and forth between cells of a module, and conductively affixed various locations along each of the cells. By making proper connections, series and/or parallel interconnection of cells may be obtained. For example, a serpentine wire may be affixed at various locations along a first cell, said locations corresponding to the location of the bus bar in the cells illustrated with reference to FIG. 3. Alternate loops of the serpentine wire are then affixed to electrically contact the substrate of the adjoining cell. In this manner series connection is established, and the bus bar is eliminated. While the aforedescribed solution does increase the usable area of the module, it does not eliminate the spaces between the individual smaller area cells. Furthermore, the serpentine wire is fragile and difficult to attach, and the resultant module is not very durable.

The instant invention provides for a large area module comprised of a plurality of interconnected smaller area photovoltaic cells. Although each of the smaller area cells include a bus bar, the small area cells are arranged in a "shingled" relationship so that the bus bar of a given smaller area cell is disposed beneath the substrate of the adjacent smaller are cell. In this manner, the bus bars are effectively hidden space between the smaller area cells are eliminated and the module presents a larger active area for photogeneration of current. Furthermore, since the bus bars do not detract from the active area of the photovoltaic device, they may be made quite large, thereby minimizing series resistance of the device. This is an important consideration since the necessity of making a trade off between shading and series resistance is eliminated. A hidden bus bar may be made quite large, an important consideration when fabricating modules from long strips of smaller area cells.

Figure 4A:
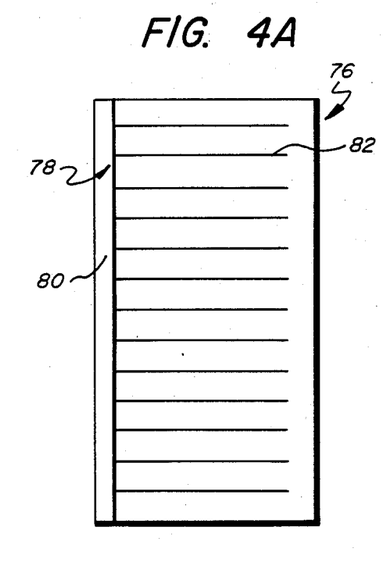
FIG. 4A is a depiction of one particular small area photovoltaic cell which may be incorporated in the improved large area device of the instant invention.

Referring now to FIG. 4A, there is depicted a small area photovoltaic cell 76 illustrating the bus-grid pattern 78 thereof. The bus-grid pattern 78 of the small area cell 76 as illustrated in FIG. 4A includes a bus bar 80 and a plurality of grid fingers 82, electrically connected thereto. The grid fingers 82 are formed of electro-plated metal and therefore are of high electrical conductivity. For this reason, and as will be noted by an inspection of the drawing, the grid fingers 82 are relatively thin. The bus bar 80 may also be formed by the same electro-plating process, although it has been found particularly advantageous to simply affix an electrically conductive metalic strip, such as a copper strip across the grid fingers 82. In addition to electro-plating processes, the bus grid pattern 78 may similarly be formed by vacuum deposition processes such as sputtering or evaporation or by electroless plating techniques and screen printing techniques as are well known to those skilled in the art.

Figure 4B:
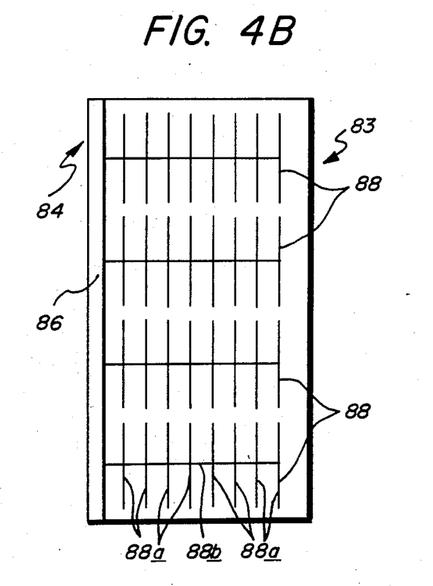
FIG. 4B is a depiction of another small area photovoltaic cell which may be utilized to fabricate large area modules of the instant invention.

Referring now to FIG. 4B, there is illustrated a second small area cell 83 illustrating a differently configured bus-grid pattern 84 formed thereupon. The bus-grid pattern 84 of FIG. 4B includes a bus bar member 86 and a plurality of grid patterns 88. The grid patterns 88 are, in this embodiment, formed by silk screening an electrically conductive paste unto the top electrode of the photovoltaic cell. The electrically conductive paste is of lower electrical conductivity than is an electroplated or a vacuum deposited metallic layer; accordingly, the grid patterns 88 are structured to include a plurality of grid fingers 88a electrically communicating with a central collection ray 88b, which electrically communicates with the bus bar 86. The bus bar 86 may also be formed from a screen printed paste or may be a copper strip affixed in electrical communication with the grid pattern 88.

As discussed previously, the smaller area photovoltaic cell, for example cell 83 of FIG. 4B, may be a single cell or may include various internal electrical configurations, the only proviso being that the bus bar member 86, form one electrical terminal of the small area cell. In accord with this principle, the smaller area cell 83 of FIG. 4B may be configured to include a plurality of photovoltaic regions, each of which is capable of functioning as an independent photovoltaic cell. When the smaller area cell 83 of FIG. 4B is configured to include a plurality of photovoltaic regions, the semiconductor material associated with each grid pattern 88 is be electrically isolated from adjacent regions. Such techniques of isolation are known to those skilled in the arts, and are described in U.S. Pat. No. 4,419,530 of Prem Nath entitled Solar Cell And Method For Producing Same, and U.S. Pat. No. 4,485,264 of Izu, et al entitled Isolation Layer For Photovoltaic Device And Method of Producing The Same, which patents are assigned to the assignee of the instant invention and the disclosed which are incorporated herein by reference.

To reiterate, the instant invention may be practiced with a wide variety of bus-grid configurations. Some bus grid configurations having utility in the practice of the instant invention are disclosed in U.S. Pat. No. 4,590,327 and the following U.S. patent application Ser. No: 699,523 filed Feb. 8, 1985 and Ser. No. 699,524 filed Feb. 8, 1985, all of which patent applications are entitled Photovoltaic Device And Method and are assigned to the assignee of the instant invention, disclosures of which are incorporated herein by reference. Regardless of the bus grid pattern utilized, or the particular configuration of photovoltaic cell employed, the instant invention may be practiced by employing any photovoltaic cell having its bus bar disposed proximate one edge thereof.

Figure 5A:
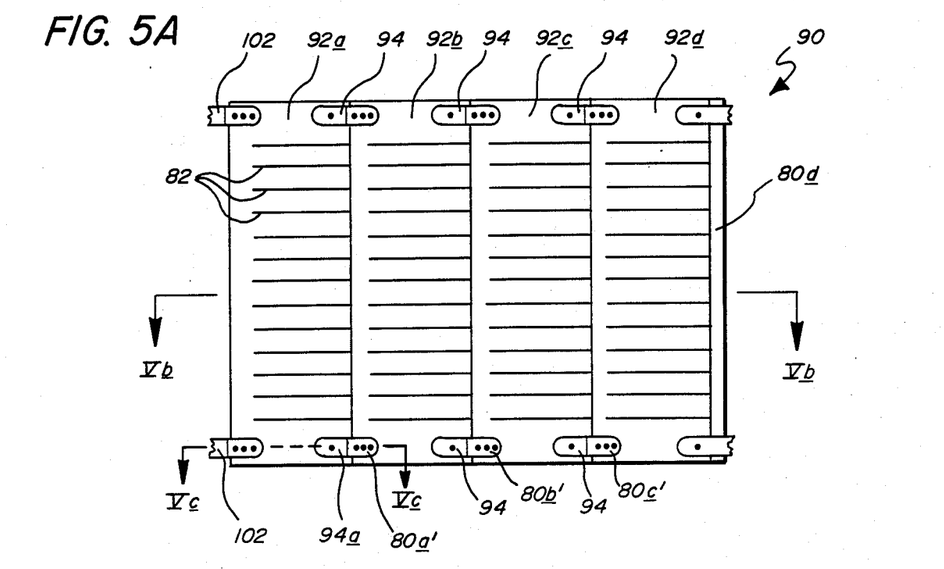
FIG. 5A is a top plan view of one configuration of large area module structured in accord with the principles of the instant invention.

Referring now to FIG. 5A there is shown a top plan view of a particular large area photovoltaic device 90 of the instant invention. The large area photovoltaic device module 90 is configured from four smaller area photovoltaic cells 92a, 92b, 92c, and 92d, generally similar to the smaller area cell 76, depicted in FIG. 4A.

Figure 5B:
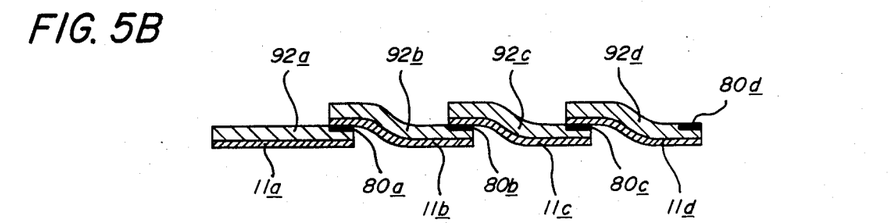
FIG. 5B is a cross-sectional view of the photovoltaic module FIG. 5A, illustrating the overlapping relationship of the smaller area cells; and, FIG. 5C is a partial cross-sectional view of the photovoltaic module of FIG. 5A, illustrating the electrical interconnection of the smaller area cells.

Although the grid fingers 82 of each of the smaller area cells 92a–92d are all visible, only the bus bar 80d of cell 92d is visible. This is because, as previously mentioned, the bus bars of the remaining cells are disposed beneath adjacent cells. That is to say, the bus bar of cell 92a is disposed beneath the substrate of cell 92b. The bus bar of cell 92b is disposed beneath the substrate of cell 92c and the bus bar of cell 92c is disposed beneath the substrate of cell 92d. This configuration will best be understood with reference to FIG. 5B which is cross-sectional view of the large area device 90 of FIG. 5A taken along line Vb—Vb. FIG. 5B shows a cross-sectional view of the four cells 92a–92d, each cell including a substrate 11a–11b and a bus bar 80a–80a.

Referring back to FIG. 5A, it will also be noted that the large area photovoltaic device 90 includes a plurality of interconnect members for establishing, in this case, a series electrical connection between adjacent smaller area cells 92a–92a. The interconnect members comprise a plurality of copper strips 94 disposed between the adjacent cells, each of which establishes electrical contact with the bus bar of a first cell and the substrate electrode of an adjacent cell thereby establishing a series current path. This particular configuration will best be understood with reference to FIG. 5C which is a cross-sectional view of a portion of the large area photovoltaic device 90 of FIG. 5A taken at the edge of the large area device 90, along line Vc—Vc.

Figure 5C:
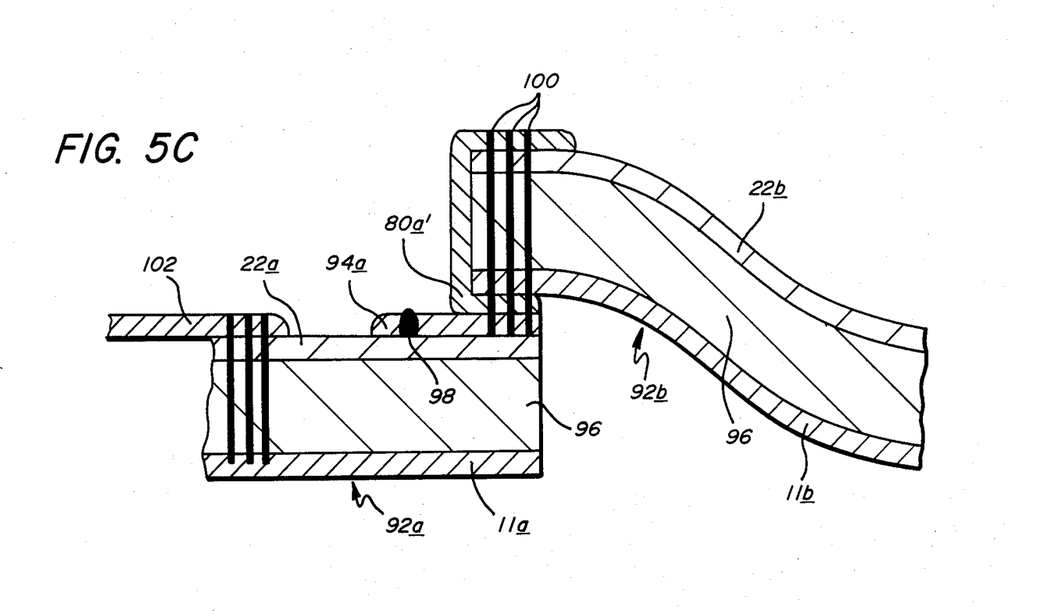

Referring now to FIG. 5C, there is shown a cross-sectional view of the edge portions of cell 92a and cell 92b. Each cell includes an electrically conductive substrate 11 which forms the base electrode thereof, a semiconductor body 96 which may for example, be generally similar to the semiconductor body described with reference to FIG. 1, and a top electrode layer 22 which may preferably be a transparent conductive oxide layer.

As illustrated, cell 92a also includes a bus bar 80a shown here in cross-section and an interconnect member 94a, preferably formed of a conductive metallic strip such as a copper foil strip affixed to the topmost TCO electrode by means such as a solder joint 98. Conductive epoxy or a similar electrically conductive adhesive may be similarly employed for this purpose. The busbar 80a of the first cell 92a is in this embodiment formed of a thin copper foil strip affixed along one edge of the cell as previously described.

As depicted herein, the end portion 80a' of the bus bar member 80a is overlapped upon the interconnect member 94a and then wrapped around the edge, and onto the top surface of, the adjacent small area cell 92b. One or more tack welds 100 is made through the overlapped portion 80a' of the bus bar 80a, through the entirety of the second smaller area cell 92b and into the lower portion of the bus bar 80a and the interconnect member 94a. In this manner, an electrical connection is established between the top TCO electrode 22a of the first cell 92a and the substrate base electrode 11b of the adjoining cell 92b thereby establishing a series electrical connection. While the tack weld 100 extends through the entirety of the second cell 92b, problems of short circuiting do not occur, owing to the high lateral resistivity of the amorphous silicon alloy layer from which the semiconductor body 96 of the cell is fabricated. Current will preferentially flow from the bar bar 80a, through the weld 100 to the substrate 11b. In a similar manner, electrical contact is established to the substrate electrode of the first photovoltaic cell by tack welding a terminal contact member 102 through that cell, and to the substrate electrode 11a thereof.

Obviously, other methods for interconnecting the individual cells may be employed, it being the essence of the instant invention that the bus bar is hidden beneath overlapping cells. For example, all contacts may be made on the rear surface of the large area photovoltaic device; that is to say, the bus bar of a first device may be affixed to the rear electrode of the adjoining cell by means such as an electrically conductive adhesive, or soldered or welded interconnect members. In another embodiment, the interconnect member, for example, 94a in FIG. 5C, may be wrapped around to the top surface of the adjoining small area cell and then tack welded therethrough to the bus bar disposed therebeneath. Large area photovoltaic devices configured in accord with the principles of the instant invention may further include encapsulating layers for purposes of protecting the device from mechanical damage and ambient conditions. For example, a large area photovoltaic device may include an optically transparent electrically insulating member affixed to at least the light incident surface of the device most proximate the top electrode members of the small area cells. The device may further include a second, electrically insulating encapsulant member affixed thereto proximate the substrate side of the plurality of small area cells. These and many other modifications may be made in keeping with the spirit of the instant invention.

While the foregoing description and discussion has generally involved amorphous silicon and germanium semiconductor alloy layers, the instant invention is obviously not solely limited to photovoltaic devices employing such materials solely. The instant invention may be advantageously practiced with any type of photovoltaic cell, such as for example, cadmium sulfide cells, copper indium diselenide cells and the like. The foregoing descriptions and discussions are merely meant to be illustrative of the practice of the instant invention. It is the following claims including all equivalents which define the instant invention.

What we claim is:

1. An improved large area, flexible photovoltaic device, said device comprised of a plurality of electrically interconnected smaller area photovoltaic cells, each of said smaller cells including:

a flexible substrate member having at least one electrically conductive base electrode region thereupon, a semiconductor body disposed upon said substrate in electrical communication with said base electrode region, and at least one relatively transparent top electrode member disposed upon the semiconductor body, said base electrode region, said semiconductor body and said top electrode member cooperating to provide at least one photovoltaic region in each of said smaller area cells for absorbing incident light and generating electrical current in response thereto;

said smaller area cells including a discrete, elongated electrically conductive bus bar disposed proximate substantially the entire length of a first edge thereof, in electrical communication with said top electrode member, for conveying said electrical current to at least one collection point proximate at least a second edge thereof;

said smaller area cells disposed in overlapping relationship so that the bus bar of at least one of said cells is disposed beneath the substrate of an adjacent cell; said device further including means for electrically interconnecting the bus bar of one cell with one of the electrodes of the adjacent cell at said at least one collection point only, whereby said cells are electrically interconnected, the surface of the large area photovoltaic device available for the generation of electrical current is maximized and flexibility of the device in the direction transverse to said elongated, electrically conductive bus bars is retained.

2. A large area photovoltaic device as in claim 1, wherein said electrically interconnecting means comprises a copper strip.

3. A large area photovoltaic device as in claim 1, wherein said electrically interconnecting means is operatively disposed to electrically interconnect the smaller area cells in series.

4. A large area photovoltaic device as in claim 1, wherein said electrically interconnecting means is operatively disposed to electrically interconnect the smaller area cells in parallel.

5. A large area photovoltaic device as in claim 1, wherein said electrically interconnecting means is operatively disposed to interconnect the smaller area cells in a mixed series-parallel relationship.

6. A large area photovoltaic device as in claim 1, wherein the semiconductor body of at least one of said plurality of small area photovoltaic cells includes a layer of amorphous silicon alloy material therein.

7. A large area photovoltaic device as in claim 1, wherein the semiconductor body of at least one of said plurality of smaller area photovoltaic cells includes a pair of doped layers of thin film semiconductor alloy material of opposite conductivity, disposed in superposed relationship.

8. A large area photovoltaic device as in claim 7 wherein in said doped layers include a substantially intrinsic layer of thin film semiconductor alloy material disposed therebetween, said triad of layers cooperating to provide an n-i-p type photovoltaic cell.

9. A large area photovoltaic device as in claim 8 wherein said semiconductor body includes at least two triads of semiconductor layers disposed electrically and optically in series, said triads cooperating to provide a tandem photovoltaic device.

10. A large area photovoltaic device as in claim 9 comprising three triads of semiconductor layers; the intrinsic layer of the triad most proximate the light incident surface of the photovoltaic device having a first band gap, the intrinsic semiconductor layer of the triad most distal the light incident surface of the photovoltaic device having a band gap smaller than that of said first intrinsic layer; and, the intrinsic layer of the intermediate triad having a band gap intermediate that of said first and second intrinsic layers.

11. A large area photovoltaic device as in claim 1 wherein each of said smaller area cells further includes an electrically conductive grid pattern operatively disposed in electrical communication with at least a portion of each of said at least one relatively transparent upper electrode members, said grid pattern electrically communicating with said bus bar.

12. A large area photovoltaic device as in claim 1, wherein each of said smaller area photovoltaic cells includes an electrically conductive grid pattern disposed upon said at least one top electrode member and an electrically conductive substrate member providing a single base electrode region thereupon, said base electrode region, said semiconductor body, and said top electrode member cooperating to provide a plurality of photovoltaic regions sharing a common base electrode.

13. A large area photovoltaic device as in claim 1, further including an optically transparent, electrically insulating encapsulant member affixed to at least the surface of said photovoltaic device most proximate the top electrode members of said smaller area cells.

14. A large area photovoltaic device as in claim 13, further including a second, electrically insulating encapsulant member affixed thereto most proximate the substrate of said plurality of small area photovoltaic cells, whereby said encapsulant layers protect the large area photovoltaic device from mechanical damage and ambient conditions.

15. A photovoltaic device as in claim 1, wherein said electrically interconnecting means comprises a metallic interconnect member in electrical communication with the bus bar of a first one of said smaller area cells at the collection point thereof and the substrate of a second one of said smaller area cells.

16. A photovoltaic device as in claim 15, wherein said interconnect member is affixed to the transparent top electrode member of the first cell by an electrically conductive joint, and the bus bar of said first cell is affixed to said interconnect member and the substrate of the second cell by an electrically conductive joint.

17. A method of manufacturing an improved, large area, flexible photovoltaic device, including the steps of:

providing a plurality of smaller area photovoltaic cells, each of said smaller area cells including a flexible substrate having at least one base electrode region thereupon, a semiconductor body disposed upon said substrate in electrical communication with said base electrode region, at least one relatively transparent top electrode member disposed upon the semiconductor body and a discrete, elongated, electrically conductive bus bar disposed proximate substantially the entire length of a first edge thereof in electrical communication with said top electrode member for conveying photogenerated current produced by the cell to at least one collection point proximate at least a second edge thereof;

disposing said smaller area cells in overlapping relationship so that the bus bar of at least one of said cells is disposed beneath the substrate of an adjacent cell; and, electrically interconnecting the bus bar of one cell with one of the electrodes of the adjacent cell at said at least one collection point only, whereby a large area photovoltaic device having a maximized active surface area for the generation of electrical current is provided and flexibility in the direction transverse to said elongated, electrically conductive bus bars is retained.

18. A method as in claim 17, wherein the step of electrically interconnecting the smaller area cells comprises connecting said cells in series.

19. A method as in claim 17, wherein the step of electrically interconnecting the smaller area cells comprises connecting said cells in parallel.

20. A method as in claim 17, wherein the step of electrically interconnecting the smaller area cells comprises connecting said cells in a mixed series parallel relationship.

21. A method as in claim 17, wherein the step of interconnecting the smaller area cells includes the further step of providing an electrically conductive metallic strip for interconnecting said cells.

22. A method as in claim 17, wherein the step of providing a plurality of smaller area cells includes providing a plurality of cells having an electrically conductive substrate and the base electrode thereof in electrical communication with said substrate; and, the step of electrically interconnecting said cells includes the step of establishing electrical communication between the bus bar of first cell and the overlying substrate of an adjacent cell at said collection point, whereby a series electrical connection is established.

23. A method as in claim 22, wherein the step of establishing electrical communication between the bus bar and the overlying substrate includes applying an electrically conductive adhesive to said bus bar at said collection point.

24. A method as in claim 22, wherein the step of establishing electrical communication between the bus bar and the overlying substrate includes the step of establishing a welded, electrically conductive connection at said collection point between said bus bar and substrate.

25. A method as in claim 22, wherein the step of establishing electrical communication between the bus bar and the overlying substrate at said collection point includes the step of soldering.

26. A method as in claim 17, wherein the step of providing a plurality of cells having a bus bar includes the step of affixing a flexible metallic bus bar strip to said cell, a terminal portion of said bus bar strip adapted to provide said collection point; and the step of electrically interconnecting the cells includes the step of extending the terminal portion of said flexible metallic strip onto the adjacent cell and electrically connecting said portion thereto.

27. A method as in claim 17, including the further step of encapsulating at least the light incident surface of said large area photovoltaic device with a light transmissive, electrically resistive synthetic polymeric member.

28. A method as in claim 17, including the further step of providing the large area photovoltaic device with at least one pair of terminals for withdrawing electrical power therefrom.

* * * * *